US006970015B1

(12) United States Patent
Chan et al.

(10) Patent No.: US 6,970,015 B1
(45) Date of Patent: Nov. 29, 2005

(54) APPARATUS AND METHOD FOR A PROGRAMMABLE TRIP POINT IN AN I/O CIRCUIT USING A PRE-DRIVER

(75) Inventors: Wai Cheong Chan, Sunnyvale, CA (US); Khusrow Kiani, Oakland, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 548 days.

(21) Appl. No.: 10/099,586

(22) Filed: Mar. 14, 2002

(51) Int. Cl.[7] .......................................... H03K 19/0175
(52) U.S. Cl. ........................................... 326/82; 326/38
(58) Field of Search .......................... 326/37–41, 82–91

(56) References Cited

U.S. PATENT DOCUMENTS

| | | | | |
|---|---|---|---|---|
| 5,418,476 A | * | 5/1995 | Strauss .......................... 326/58 |
| 5,440,244 A | * | 8/1995 | Richter et al. ................. 326/37 |
| 5,933,025 A | * | 8/1999 | Nance et al. .................. 326/81 |
| 6,242,943 B1 | | 6/2001 | El-Ayat ......................... 326/39 |
| 6,448,809 B2 | * | 9/2002 | Goetting et al. ............... 326/44 |

* cited by examiner

Primary Examiner—Don Le
(74) Attorney, Agent, or Firm—Darby & Darby PC; John W. Branch

(57) ABSTRACT

The invention enables the performance of the input and output stages of an I/O circuit to be modified after an IC is manufactured. In one embodiment, the I/O circuit includes an output driver, programmable pre-driver, programmable Schmitt-trigger input buffer, control circuit and logic circuit. Depending on the number of pull-up and pull-down MOS transistor pairs or "cells" that are enabled in the programmable pre-driver and their different sizes, the overall sizing ratio imbalance between the transistors may be programmed. In particular, the high and low trip points for activation of the output driver is related to an imbalance in the overall sizing ratio of transistors enabled in the programmable pre-driver. This affects the timing characteristics of the output driver.

17 Claims, 7 Drawing Sheets

US 6,970,015 B1

APPARATUS AND METHOD FOR A PROGRAMMABLE TRIP POINT IN AN I/O CIRCUIT USING A PRE-DRIVER

FIELD OF THE INVENTION

The present invention relates to output drivers and, more particularly, to enabling programmable trip points for an output driver with pre-driver elements.

BACKGROUND INFORMATION

An integrated circuit (IC) is usually constructed from a small chip of semiconductor material upon which an array of active/passive components have been constructed and connected together to form a functioning circuit. An IC is generally encapsulated in a plastic housing (chip) with signal, power supply, and control pins accessible for connection to external electronic circuitry. In some applications, an IC employs an input/output (I/O) circuit that is coupled to a selected signal pin where input signals are received and subsequently processed by an array of active/passive components in an input buffer. Also, output signals that were processed by the IC are presented at the same selected pin using an output stage that may include pre-driver and output driver elements. The output driver "pulls-up" or "pulls-down" a voltage level of the output in response to the signals generated by the array of components, thereby providing logic "1" and "0" signals which are transmitted to the external circuitry connected to the output. By adjusting the trip points of the pre-driver, different AC timing characteristics (delay and slew rate) of the output driver can be achieved.

A typical output driver includes a CMOS inverter with a p-channel pull-up transistor and an n-channel pull-down transistor. The n-channel and p-channel transistors in the CMOS inverter are often designed to supply enough current to a large load while the output swings between the rails of the power supply at a relatively high frequency. Also, circuitry external to the IC is usually employed to couple output drivers to a load condition.

Output drivers can be used to drive a signal onto a bus line that has a relatively large load. Output drivers are often designed and simulated to meet specific application requirements such as load size, as well as speed and/or noise compensation. Typically, output drivers are designed to quickly drive signals under expected load conditions, but at the same time, not too quickly so as to cause excessive noise problems. Additionally, a particular application of an output driver may be limited to a maximum slew rate so as to minimize undesirable high frequency components of the output signal and reduce unwanted radiation.

When the real world performance of an I/O circuit for an IC did not satisfy specification requirements, complete redesign of the circuit was often necessary. Historically, the trip points of an output stage or an input buffer were not adjustable after the IC was manufactured nor readily modified to compensate for a greater and/or different range of actual input/output loading conditions. Since an IC with non-conforming input/output performance is usually unfit for its intended purpose, it will be appreciated that enabling the performance of an I/O circuit to be tuned to meet specification requirements after the IC is reduced to silicon would reduce delays and costs associated with redesigning an I/O circuit for an IC manufactured for a particular use.

SUMMARY

In accordance with the invention, an apparatus for programming the operation of an Input/Output (I/O) circuit connected to a load includes an input buffer for receiving an input signal from the load. An output of the input buffer is coupled to another circuit. Also, the I/O circuit includes an output stage with a programmable pre-driver that is coupled to an output driver. The output driver provides an output signal for driving the load and the programmable pre-driver receives a signal from the other circuit that corresponds to the output signal. A control circuit enables the programmable pre-driver to determine a trip point for a high component and another trip point for a low component of the output signal driven by the output driver. The programmable pre-driver enables the operation of the output driver to be adjusted to suit different conditions on the load.

In accordance with another aspect of the invention, the programmable pre-driver includes at least one cell, each cell includes at least two pull-up transistors and at least two pull-down transistors. Also, hysteresis in the response of the programmable pre-driver is related to an imbalance in the sizing ratio of each pull-up transistor and each pull-down transistor in each enabled cell. The hysteresis is employed to define a value for the trip point of the high component of the output signal and another value for the other trip point of the low component of the output signal.

In accordance with still another aspect of the invention, a logic circuit is coupled to the programmable pre-driver that enables selectively activating one or more cells so that a position for the trip point for the high component of the output signal and the other trip point for the low component of the output signal is adjustable for different conditions.

In accordance with yet another aspect of the invention, a logic circuit is coupled to the programmable pre-driver and provides for separately and selectively enabling one or pull-up transistors and pull-down transistors so that a position for the trip point for the high component of the output signal and another position for the other trip point for the low component of the output signal are separately adjustable for different conditions. Additionally, the pull-up transistors and pull-down transistors can be CMOS transistors. Also, the input buffer may be a programmable Schmitt trigger input buffer.

The invention may also be implemented as methods that perform substantially the same functionality as the embodiments of the invention discussed above and below.

These and other features as well as advantages, which characterize the invention, will be apparent from a reading of the following detailed description and a review of the associated drawings.

DETAILED DESCRIPTION

Figure 1:
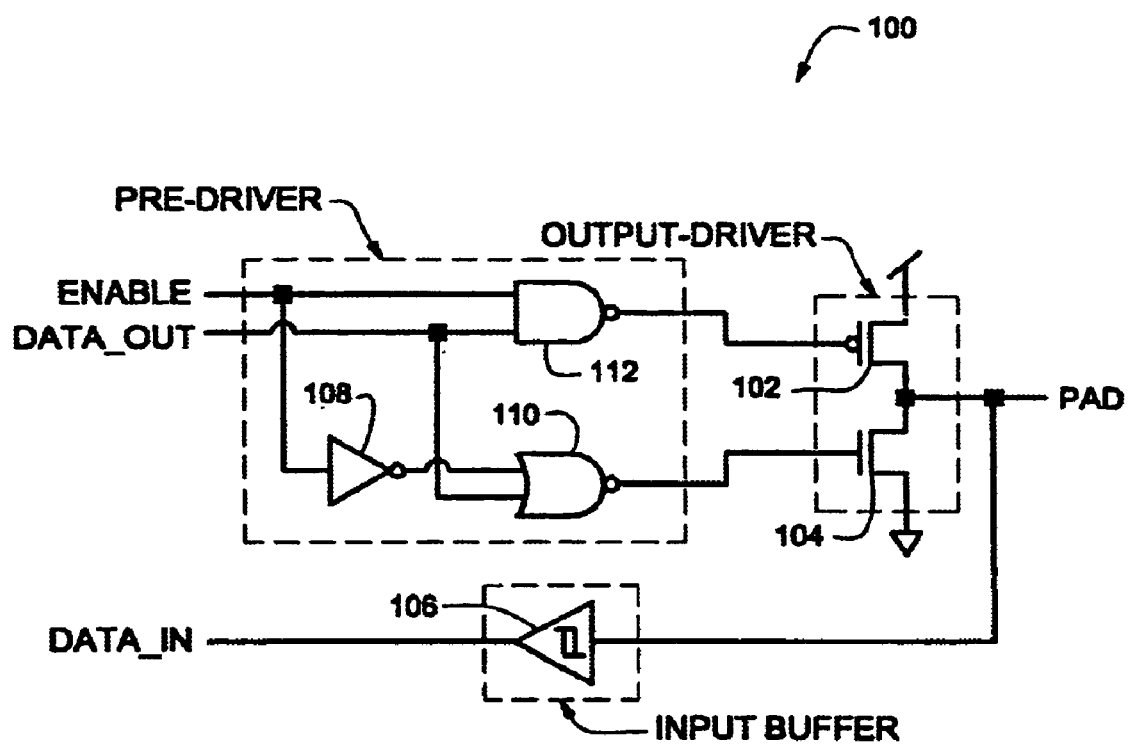
FIG. 1 illustrates a schematic diagram of a non-programmable I/O circuit that includes a Schmitt trigger input buffer, output driver and pre-driver.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

The present invention generally enables the performance of the input and output stages of an I/O circuit to be modified after an IC is manufactured. In one embodiment, the I/O circuit includes an output driver, programmable pre-driver, programmable Schmitt trigger input buffer, control circuit and logic circuit. Depending on the number of pull-up and pull-down MOS transistor pairs or "cells" that are enabled in the programmable pre-driver and their different sizes, the overall sizing ratio imbalance between the transistors may be programmed. In particular, the high and low trip points for activation of the output driver is related to an imbalance in the overall sizing ratio of transistors enabled in the programmable pre-driver. Due to this tuning capability of trip points, the timing characteristics of the output driver can be adjusted.

For example, when the slew rate of the output drive signal is not fast enough to properly drive a load for a particular application, more pull-up and pull-down MOS transistor cells in the programmable pre-driver can be activated to lower the high/low trip points presented to the output driver. Alternatively, when the slew rate of the output drive signal for a load condition is determined to be faster than specified for a particular application, pull-up and pull-down MOS transistor pairs in the programmable pre-driver can be deactivated to raise the high/low trip points presented to the output driver. In this way, the output driver can be adjusted to drive a particular load condition through the programming of the pre-driver.

Similarly, the high/low trip points for a programmable Schmitt trigger input buffer can be programmed so that the trip points for triggering the operation of the buffer can be selected. The programmable Schmitt trigger input buffer includes several pull-up and pull-down Metal Oxide Semiconductor (MOS) transistors arranged in multiple pairs or "cells"; and control lines from the control circuit that disable/enable the operation of each transistor cell in the programmable Schmitt-trigger input buffer.

Depending on the number of pull-up and pull-down MOS transistors that are enabled in the programmable Schmitt trigger input buffer and their respective sizes, the overall sizing ratio imbalance between the transistors may be programmed. As a result, the high and low trip points for activation of the Schmitt trigger input buffer is programmable by selecting an overall sizing ratio for the pull-up and pull-down MOS transistors enabled in the buffer.

Thus, the invention provides programmable "post-silicon" tuning of the performance of an output stage for an I/O circuit by enabling/disabling pull-up and pull-down MOS transistor "cells" in a programmable pre-driver coupled to an output driver. Also, the invention enables post-silicon tuning of the operation of an input stage for an I/O circuit by enabling/disabling pull-up and pull-down MOS transistor cells in a Schmitt-trigger input buffer. This post silicon tuning can be provided through external sources coupled to particular pins on the IC or programmed through the core logic in the IC. Additionally, the initial tuning of the operation of the output stage and input stage can be performed during manufacture to suit a particular application.

FIG. 1 illustrates an overview schematic of non-programmable I/O circuit 100 that includes an Input stage with a Schmitt trigger input buffer 106 and an Output stage that comprises a Pre-driver and Output Driver. The Pre-driver includes NAND gate 112, NOR gate 110 and inverter 108 that are arranged to control the operation of and provide output signals to the Output Driver. The Output Driver includes PMOS transistor 102 and NMOS transistor 104, which are coupled in series between the Voltage Supply ($V_{cc}$) and ground. Also, one end of a Pad line is coupled to the junction of MOS transistors 102 and 104 and the line's other end is coupled to at least one pin of the IC.

An Enable line and Data_Out line are coupled to the inputs of NAND gate 112 and the Data_Out line and an inverted Enable line are coupled to the inputs of NOR gate 110. Further, the Data_Out line and Enable line are coupled to the core logic of the IC. The output of NAND gate 112 is coupled to the gate of PMOS 102 and the output of NOR gate 110 is coupled to the gate of NMOS 104. Thus, depending on the outputs of the Pre-driver (NAND gate 112 and NOR gate 110), the Output Driver MOS transistors will be biased to either pull-up or pull-down an output signal on the Pad line.

Figure 2:
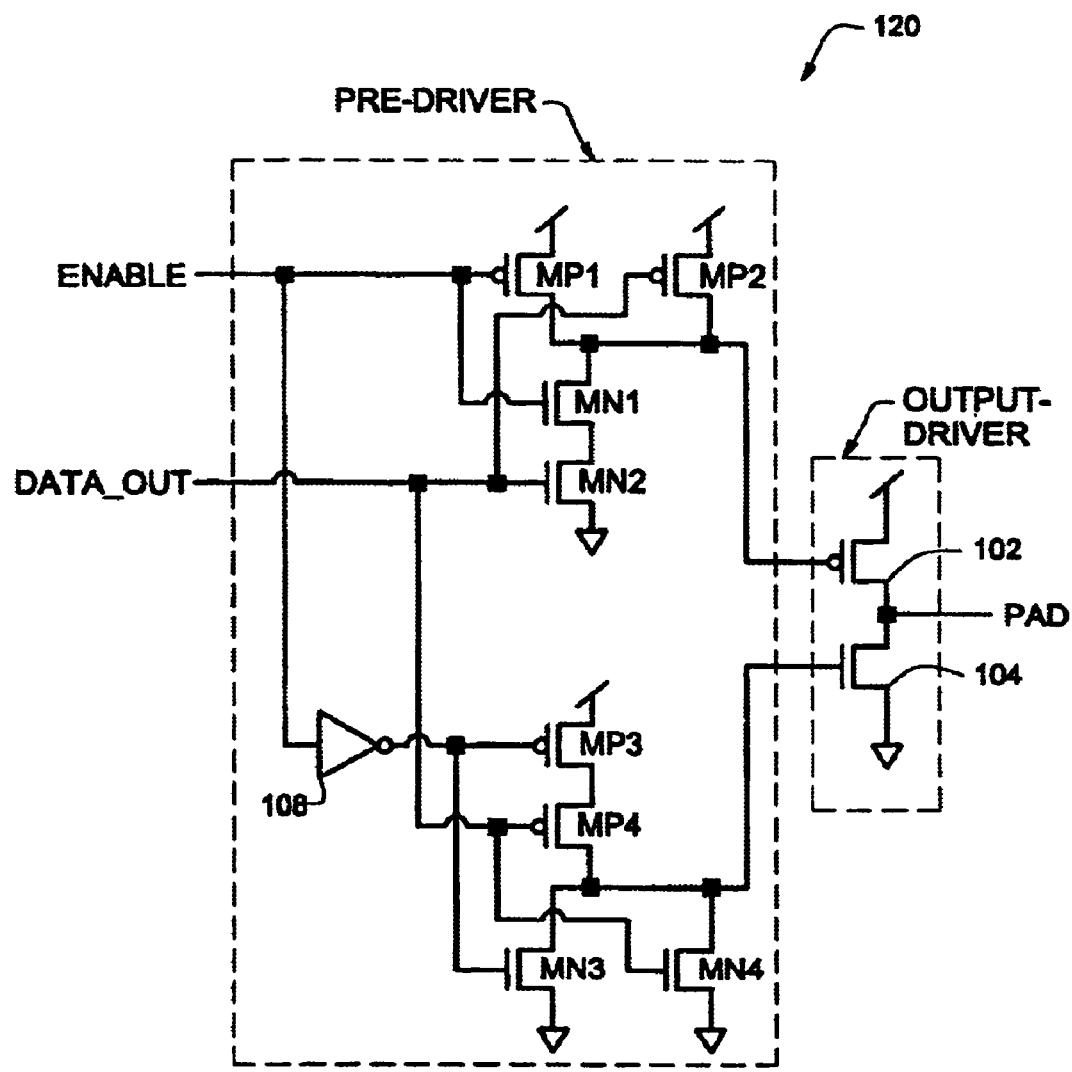
FIG. 2 shows a schematic diagram of the discrete elements included in the pre-driver and output driver for the non-programmable I/O circuit.

FIG. 2 shows a schematic diagram 120 of the individual elements that are employed in the output stage for the Pre-driver and Output Driver illustrated in FIG. 1. In particular, NAND gate 112 is represented by a combination of PMOS transistors MP1 and MP2 and NMOS transistors MN1 and MN2. Also, NOR gate 110 is represented by an arrangement of PMOS transistors MP3 and MP4 and NMOS transistors MN3 and MN4. As shown in FIG. 1, the Output Driver includes PMOS transistor 102 and NMOS transistor 104.

Figure 3:
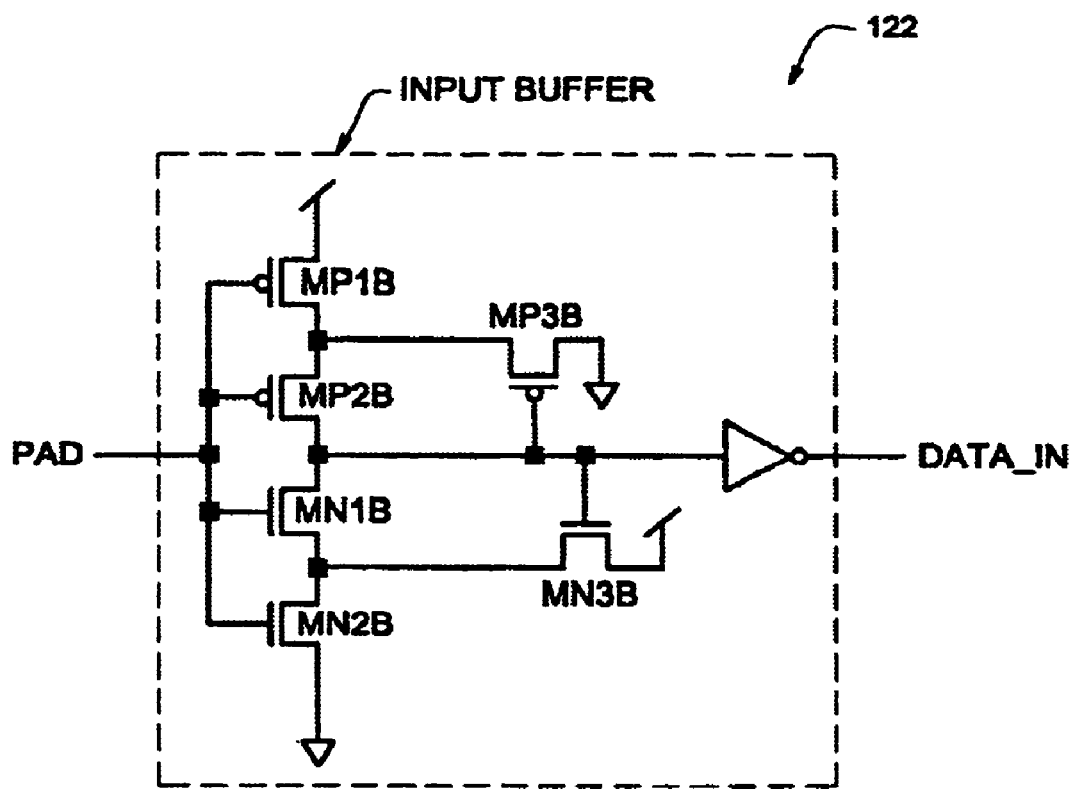
FIG. 3 illustrates a schematic diagram of the discrete elements included in the Schmitt-trigger input buffer for the non-programmable I/O circuit.

FIG. 3 illustrates a schematic diagram 122 of the individual elements that are employed in the Schmitt Trigger Input buffer shown in FIG. 1. The buffer includes PMOS transistors MP1B, MP2B and MP3B for handling the low state of an input signal received at the Pad line. Similarly, NMOS transistors MN1B, MN2B and MN3B handle the high state of the input signal received at the Pad line. The input of the Schmitt Trigger input buffer is coupled to one of the IC's pins through the Pad line and the output of the buffer is presented on the Data_In line to the core logic of the IC.

Additionally, for at least the embodiments shown in FIGS. 1–3, the high/low trip points for the Schmitt Trigger Input buffer are set during design and are not readily adjusted at a later date. Similarly, the amount of current that the Output Driver can provide and its speed of operation are fixed by design.

Figure 4:
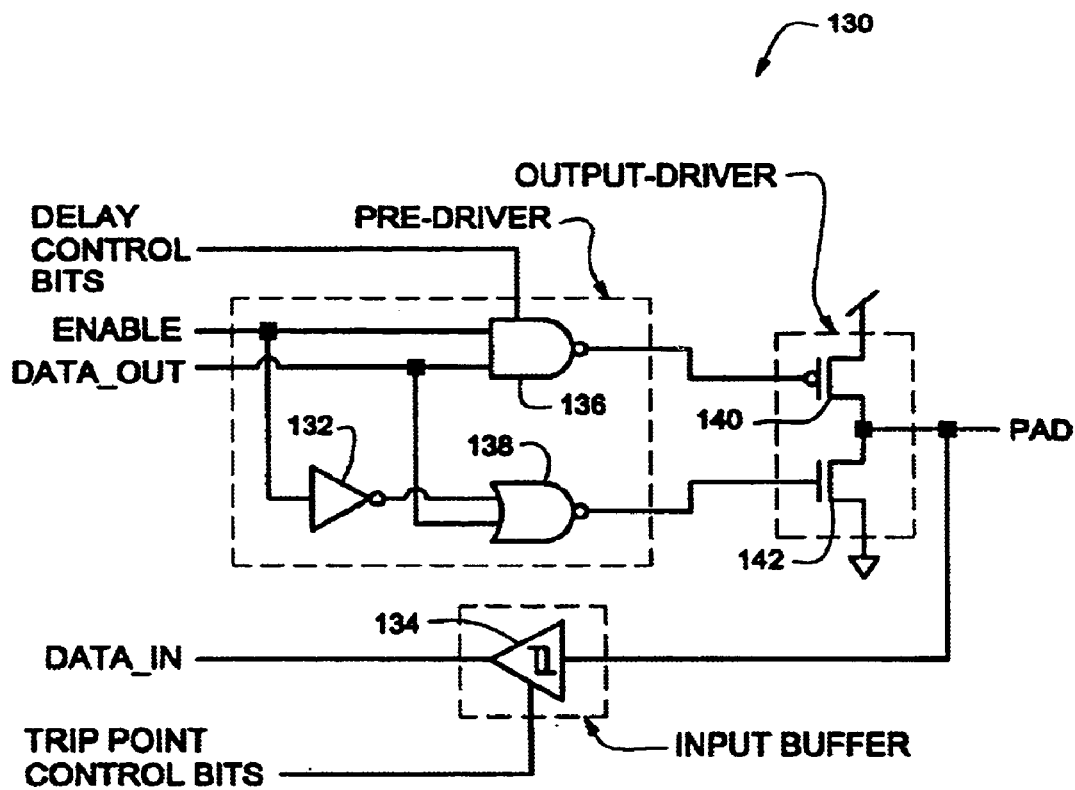
FIG. 4 shows a schematic diagram of a programmable I/O circuit that includes a programmable Schmitt-trigger input buffer, output driver and a programmable pre-driver.

FIG. 4 shows a schematic diagram of an exemplary embodiment of programmable I/O circuit 130 that includes programmable Schmitt Trigger Input buffer 134 and an Output stage that comprises a programmable Pre-driver and an Output Driver. The programmable Pre-driver includes programmable NAND gate 136, NOR gate 138 and inverter 132 that are arranged to control the operation of and provide output signals to the Output Driver, which includes PMOS transistor 140 and NMOS transistor 142. Thus, depending on the outputs of the Pre-driver (NAND gate 136 and NOR gate 138), the Output Driver MOS transistors will be biased to either pull-up or pull-down an output signal on the Pad line.

An Enable line and Data_out line are coupled to the inputs of programmable NAND gate 136 and the Data_out line and an inverted Enable line are coupled to the inputs of NOR gate 138. Also, the Data_out line and Enable line are coupled to the core logic of the IC and the Pad line is coupled to a pin on the IC. The output of NAND gate 136 is coupled to the gate of PMOS transistor 140 and the output of NOR gate 138 is coupled to the gate of NMOS transistor 142. Also, a control line is coupled to programmable NAND gate 136 and a control line is coupled to Schmitt trigger input buffer 134.

Figure 5:
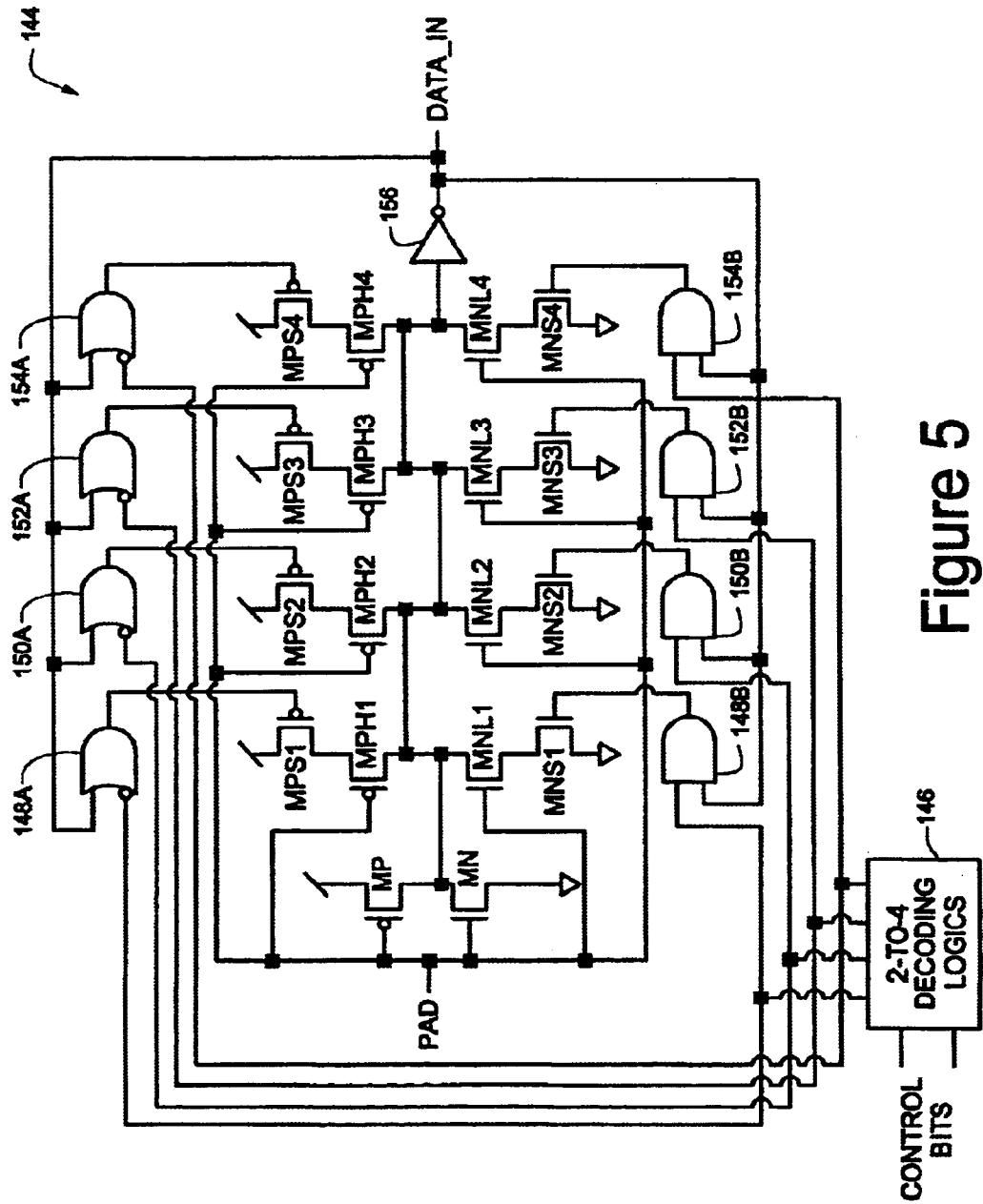
FIG. 5 illustrates a schematic diagram of the discrete elements in the programmable Schmitt-trigger input buffer for the programmable I/O circuit.

FIG. 5 illustrates a programmable Schmitt trigger input buffer 144 with logic circuitry that includes logic decoder 146, AND gates 148b, 150b, 152b and 154b, and NOR gates 148a, 150a, 152a and 154a. The logic decoder 146 is employed to enable pull-up and pull-down MOS transistor cells in the programmable Schmitt-trigger input buffer 144. In one embodiment, the logic decoder 146 employs a 2-to-4 bit decoding mechanism to selectively enable MOS transistor cells within the programmable Schmitt-trigger input buffer 144. The logic decoder 146 is controlled by two control lines and provides a separate output on one of four logic lines to an input of each of the AND and NOR gates. Also, the output of inverter 156 is coupled to the inputs of the AND gates, inputs of the NOR gates and the Data_In line, which is coupled to the core logic of the IC. The four logic lines correspond to the number of MOS transistor cells within the exemplary Schmitt-trigger input buffer 144 that can be selectively enabled or disabled to modify the performance of the input buffer. Additionally, the input of programmable Schmitt Trigger input buffer 144 is coupled to one of the IC's pins through the Pad line and the output of the buffer is presented on the Data_In line to the core logic of the IC.

Figure 6:
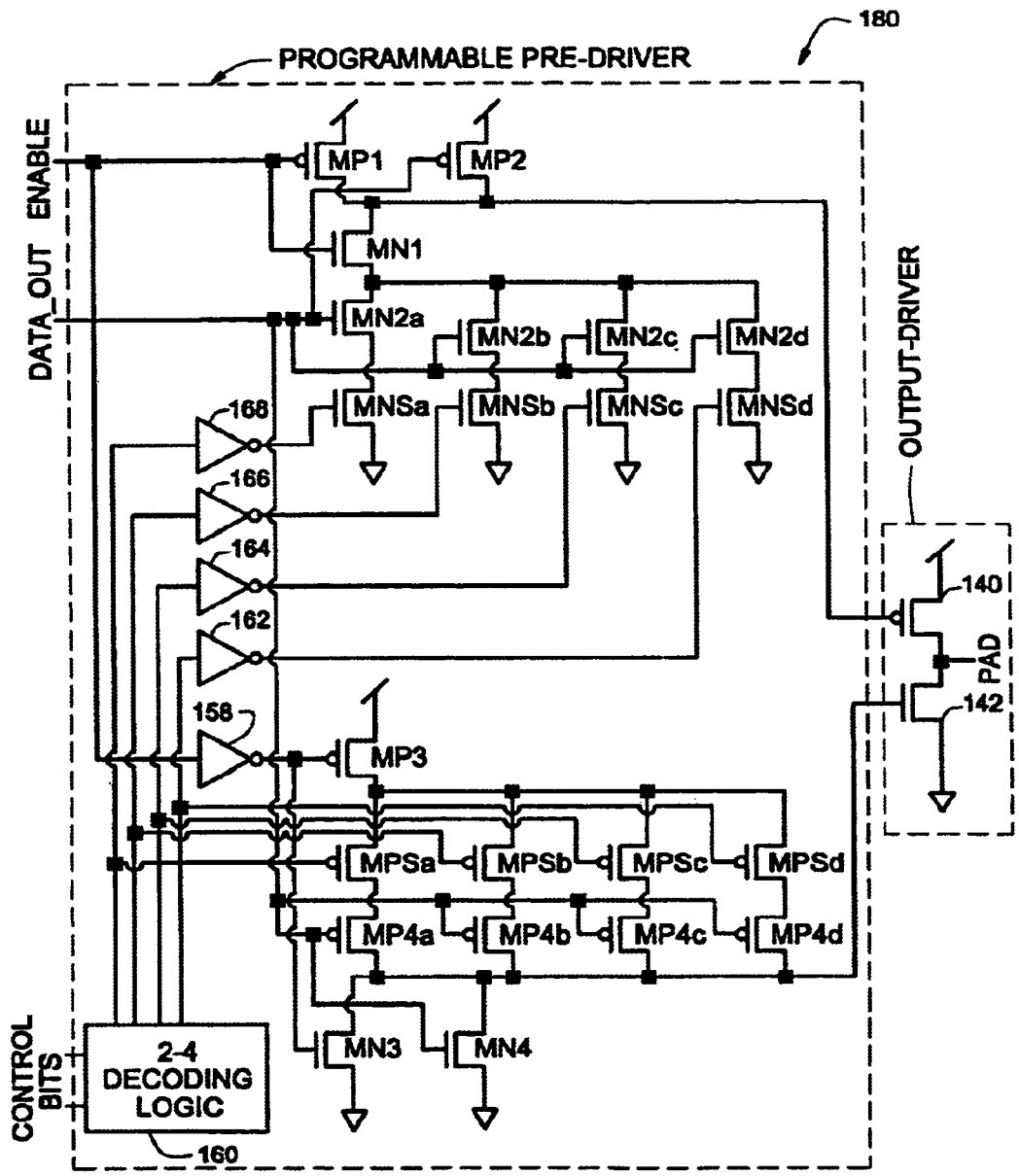
FIG. 6 shows a schematic diagram of the discrete elements included in the output driver and programmable pre-driver for the programmable I/O circuit.

FIG. 6 shows a schematic overview 180 of a programmable Pre-driver and an Output driver. The Output driver includes PMOS transistor 140 and NMOS transistor 142 which are coupled in series between the Voltage supply ($V_{cc}$) and ground. A Pad line is coupled to a pin on the IC and to the junction of PMOS transistor 140 and NMOS transistor 142 where the output signal is provided. Also, the gate of PMOS transistor 140 is tied to an array of selectable pull-up MOS transistors in the programmable Pre-driver. Similarly, the gate of NMOS transistor 142 is tied to an array of selectable pull-down MOS transistors in the programmable Pre-driver. An Enable line and a Data_Out line are coupled to the array of selectable pull-up MOS transistors; and the Data_Out line and an inverted Enable line (by inverter 158) are coupled to the array of selectable pull-down MOS transistors. The Data_Out line and the Enable line are also coupled to the core logic of the IC.

The physical sizes of the pull-down transistors MN2a–d are larger than the sizes of the respective pull-down transistors MNSa–d, i.e., transistors MN2a–d operate as switches. The high trip point of the Pre-driver (which is the inputted to the Output Driver) is determined by the imbalance in the overall sizing ratio caused by the pull-down transistors MNSa–d that are enabled, and which control the operation of the Output Driver's pull-up transistor 140. Similarly, the physical sizes of the pull-up transistors MP4a–d are larger than the sizes of the respective pull-up transistors MPSa–d, i.e., transistors MP4a–d act as switches. Also, the low trip point of the programmable Pre-driver is determined by the overall sizing ratio imbalance caused by each of the pull-up transistors MPSa–d that are enabled, and which controls the operation of the Output Driver's pull-down transistor 142. In this way, the hysteresis of the Pre-driver is related to an imbalance in the sizing ratio of each pull-up transistor and each pull-down transistor in each enabled cell and this hysteresis defines the value for the trip points where the Pre-driver enables the operation of the Output Driver. Thus, in the exemplary embodiment, at least four different imbalanced overall sizing ratios can be separately selected by the state of the two control lines for the pull-up and pull-down MOS transistors in the Pre-driver. This overall imbalanced sizing ratio determines the speed of operation through the selection of different sets of high and low trip points for the Output Driver.

The Pre-driver includes logic circuitry that includes logic decoder 160, and inverters 162, 164, 166 and 168. The logic decoder 160 is employed to selectively enable pull-up and pull-down MOS transistor cells in the programmable Pre-driver. In one embodiment, the logic decoder 160 employs a 2-to-4 bit decoding mechanism to selectively enable/disable MOS transistor cells within the programmable Pre-driver. The logic decoder 160 is controlled by two control lines and provides separate outputs on four logic lines to the respective gates of pull-up and pull-down MOS transistors in each of the four cells. Thus, as different combinations of cells of pull-up and pull-down transistors are enabled in the Pre-driver in accordance with the state of the control lines at logic decoder 160, the high/low trip points and performance of the Output Driver can be tuned for different speed.

In the Output Driver, NMOS transistor 142 and PMOS transistor 140 are sized significantly larger than the pull-up and pull-down MOS transistors included in each cell. For example, the Output Driver MOS transistors may be sized to provide a maximum of 100 milliamps of current. However, by activating (through programming) a different number of pre-driver cells, different rise/fall timing characteristics on the Output Driver can be achieved. Since the Output Driver's timing can be tuned by individually controlling each of the pull-up/pull-down cells, the switching speed versus noise of the Output Driver can be optimized.

Figure 7:
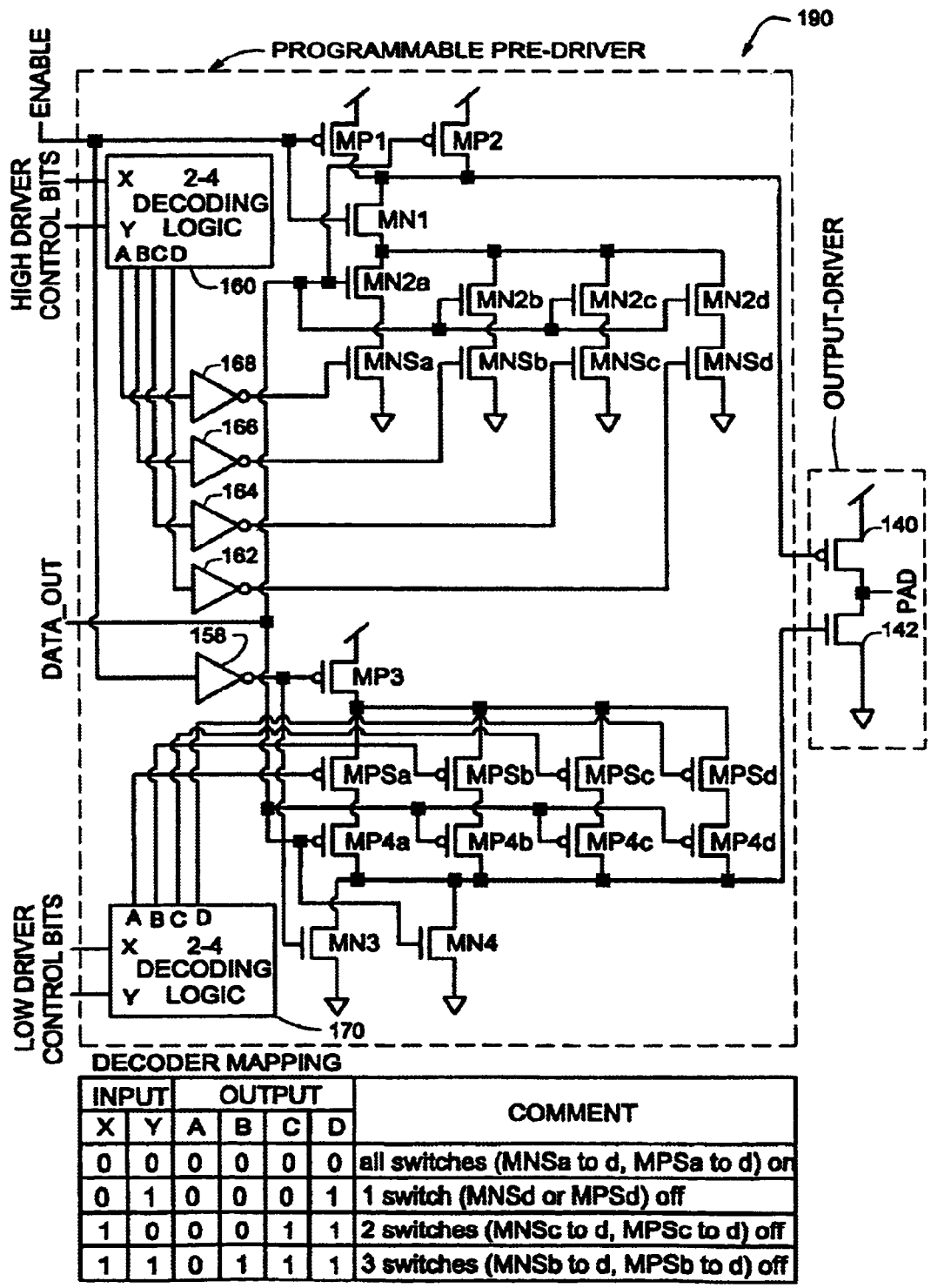
FIG. 7 illustrates a schematic diagram of the discrete elements included in the output driver and a programmable "high/low" pre-driver for the programmable I/O circuit, in accordance with the present invention.

FIG. 7 shows a schematic overview 190 of a programmable Pre-driver and an Output Driver that is substantially similar to the arrangement of components illustrated in FIG. 6, albeit different in other ways. In particular, logic decoder 160 is arranged to separately control the operation of the pull-down MOS transistors in each cell of the programmable Pre-driver. Similarly, another logic decoder 170 is included for separately controlling the pull-up MOS transistors in each cell of the programmable Pre-driver. It is understood that logic decoder 170 and logic decoder 160 may separately program different asymmetrical configurations for pull-up and pull-down MOS transistors that control the operation of the Output Driver's pull-up MOS transistor 140 and pull-down MOS transistor 142.

Additionally, although either/both of the control lines and the control lines can be coupled to the core logic of the IC, it is understood that these lines could also be coupled to one or more external pins of the IC for post-silicon tuning. Also, the number of control lines can vary depending on the number of cells to be controlled in the Schmitt-trigger input buffer and the Pre-driver.

Although not shown, other logic decoders that provide a greater or lesser number of control lines may be employed to individually program pull-up and pull-down MOS transistors in cells for either the programmable Schmitt Trigger Input buffer or the Pre-driver. It is understood that the same functions of control can be achieved by using other logic gates in other configurations to accomplish substantially the same result with a relatively short response time. Additionally, although not shown, the input signal could be received on a line that is separate from the line that the output signal is driven onto.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for programming the operation of an Input/Output (I/O) circuit connected to a load, comprising:
   (a) an input buffer for receiving an input signal from the load, wherein an output of the input buffer is coupled to another circuit;
   (b) an output stage that includes a programmable pre-driver that is coupled to an output driver, the output driver provides an output signal for driving the load and the pre-driver receives a signal from the other circuit that corresponds to the output signal;
   (c) at least one cell that is included in the programmable pre-driver, wherein each cell includes at least two pull-up transistors and at least two pull-down transistors, and wherein hysteresis is provided in the response of the programmable pre-driver that is related to an imbalance in the sizing ratio of each pull-up transistor and each pull-down transistor in each enabled cell and wherein the hysteresis defines a value for the trip point of the high component of the output signal and another value for the other trip point of the low component of the output signal; and
   (d) a control circuit that enables the programmable pre-driver to determine a trip point for a high component and another trip point for a low component of the output signal driven by the output driver, wherein the programmable pre-driver enables the operation of the output driver to be adjusted to suit different conditions on the load.

2. The apparatus of claim 1, further comprising a logic circuit that is coupled to the programmable pre-driver and provides for selectively enabling one or more cells so that a position for the trip point for the high component of the output signal and another position for the other trip point for the low component of the output signal are adjustable for different conditions.

3. The apparatus of claim 1, further comprising a logic circuit that is coupled to the programmable pre-driver and provides for separately and selectively enabling one or pull-up transistors and pull-down transistors so that a position for the trip point for the high component of the output signal and another position for the other trip point for the low component of the output signal are separately adjustable for different conditions.

4. The apparatus of claim 1, wherein the pull-up transistors and pull-down transistors are CMOS transistors.

5. The apparatus of claim 1, wherein each transistor included in the output driver is sized substantially larger than each pull-up and pull-down transistor in the programmable pre-driver, wherein the substantially larger size of each transistor included in the output driver reduces the noise in the output signal.

6. The apparatus of claim 1, wherein the other trip point for the low component of the output signal operates on transitions from the high state to the low state of the output signal and the trip point for the high component of the output signal operates on transitions from the low state to the high state of the output signal.

7. The apparatus of claim 1, further comprising a pin for an integrated circuit where the output signal is driven and the input signal is received on the same pin.

8. The apparatus of claim 1, wherein the input buffer is a programmable Schmitt-trigger input buffer.

9. The apparatus of claim 8, wherein the Schmitt trigger input buffer includes at least one cell, each cell includes at least two pull-up transistors and at least two pull-down transistors.

10. The apparatus of claim 9, further comprising hysteresis in the response of the programmable Schmitt trigger input buffer that is related to an imbalance in the sizing ratio of each pull-up transistor and each pull-down transistor in each enabled cell, wherein the hysteresis defines a value for the trip point of the high component of the input signal and another value for the other trip point of the low component of the input signal.

11. The apparatus of claim 9, further comprising a logic circuit that is coupled to the programmable Schmitt trigger input buffer and provides for selectively enabling one or more cells so that a position for the trip point for the high component of the input signal and the other trip point for the low component of the input signal is adjustable for different conditions.

12. The apparatus of claim 9, further comprising a logic circuit that is coupled to the programmable Schmitt trigger input buffer and provides for separately and selectively enabling one or pull-up transistors and pull-down transistors so that a position for the trip point for the high component of the input signal and the other trip point for the low component of the input signal is separately adjustable for different conditions.

13. An apparatus for programming the operation of an Input/Output (I/O) circuit connected to a load, comprising:
   (a) a programmable Schmitt trigger input buffer for receiving an input signal from the load, wherein an output of the input buffer is coupled to another circuit;
   (b) an output stage that includes a programmable pre-driver that is coupled to an output driver, wherein the output driver provides an output signal for driving the load and the pre-driver receives a signal from the other circuit that corresponds to the output signal;

(c) a control circuit that enables the programmable pre-driver to determine a trip point for a high component and another trip point for a low component of the output signal driven by the output driver, wherein the programmable pre-driver enables the operation of the output driver to be adjusted to suit different conditions on the load; and (d) another control circuit that enables the programmable Schmitt trigger input buffer to determine a trip point for a high component and another trip point for a low component of the input signal, wherein the programmable Schmitt trigger input buffer enables its operation to be adjusted to suit different conditions on the input signal.

14. A method for programming the operation of an Input/Output (I/O) circuit connected to a load, comprising:

(a) employing a programmable input buffer to receive an input signal from the load, wherein an output of the input buffer is coupled to another circuit;

(b) employing an output driver to provide an output signal for driving the load and employing a programmable pre-driver to receive a signal from the other circuit that corresponds to the output signal;

(c) employing the programmable pre-driver to determine a trip point for a high component and another trip point for a low component of the output signal outputted by the output driver, wherein the programmable pre-driver enables the operation of the output driver to be adjusted to suit different conditions on the load; and (d) employing the programmable input buffer to determine a trip point for a high component and another trip point for a low component of the input signal, wherein hysteresis of the programmable pre-driver is employed to define a position for the trip point of the high component of the input signal and another position for the other trip point of the low component of the input signal, and wherein the programmable input buffer enables its operation to be adjusted to suit different conditions on the input signal.

15. The method of claim 14, further comprising employing hysteresis of the programmable pre-driver to define a position for the trip point of the high component of the output signal and another position for the other trip point of the low component of the output signal.

16. The method of claim 14, further comprising separately and selectively enabling pull-down transistors and pull-up transistors included with the programmable pre-driver so that each position of the programmable pre-driver's trip points are adjustable for different output signal conditions.

17. An apparatus for programming the operation of an Input/Output (I/O) circuit connected to a load, comprising:

(a) means for an input buffer for receiving an input signal from the load, wherein an output of the input buffer is coupled to another circuit, and wherein the input buffer is a programmable Schmitt-trigger input buffer;

(b) means for an output stage that includes a programmable pre-driver that is coupled to an output driver, the output driver provides an output signal for driving the load and the pre-driver receives a signal that corresponds to the output signal; and (c) means for a control circuit that enables the programmable pre-driver to determine a trip point for a high component and another trip point for a low component of the output signal driven by the output driver, wherein the programmable pre-driver enables the operation of the output driver to be adjusted to suit different conditions on the load.

* * * * *

UNITED STATES PATENT AND TRADEMARK OFFICE
CERTIFICATE OF CORRECTION

PATENT NO. : 6,970,015 B1  Page 1 of 1
DATED : November 29, 2005
INVENTOR(S) : Wai Cheong Chan et al.

It is certified that error appears in the above-identified patent and that said Letters Patent is hereby corrected as shown below:

Column 5,
Lines 26, 27-28 and 29, delete "Data_out line" and insert -- Data_Out line --.

Column 7,
Line 52, delete "cell" and insert -- cell, --.

Signed and Sealed this

Twenty-third Day of May, 2006

JON W. DUDAS
*Director of the United States Patent and Trademark Office*